United States Patent
Potthast et al.

[11] Patent Number: 5,932,936
[45] Date of Patent: Aug. 3, 1999

[54] SWITCH MATRIX

[75] Inventors: Andreas Potthast, Forchheim; Georg Rauh, Nuremberg, both of Germany

[73] Assignee: Siemens Aktiengesellschaft, Munich, Germany

[21] Appl. No.: 09/032,786

[22] Filed: Mar. 2, 1998

[30] Foreign Application Priority Data

Mar. 6, 1997 [DE] Germany .................. 197 09 244

[51] Int. Cl.[6] .................................................. H02B 1/24
[52] U.S. Cl. ..................... 307/113; 307/112; 307/147
[58] Field of Search .............................. 307/113, 112, 307/132 R, 147, 11, 12, 13, 18, 29, 42; 333/101, 105

[56] References Cited

U.S. PATENT DOCUMENTS

| | | | |
|---|---|---|---|
| 3,979,586 | 9/1976 | Thornburg | 250/208.1 |
| 4,467,221 | 8/1984 | Koppl | 307/112 |
| 4,484,086 | 11/1984 | Koppl | 307/112 |
| 5,198,809 | 3/1993 | Day | 340/825.16 |
| 5,469,001 | 11/1995 | Vaillant | 307/113 |
| 5,689,686 | 11/1997 | Nazarian et al. | 395/500 |
| 5,754,118 | 5/1998 | Brunner | 340/825.79 |

FOREIGN PATENT DOCUMENTS 0 138 637   4/1985   European Pat. Off. .
0 390 476  10/1989   Germany .

*Primary Examiner*—Jeffrey Gaffin
*Assistant Examiner*—Jonathan S. Kaplan
*Attorney, Agent, or Firm*—Hill & Simpson

[57] ABSTRACT

A switch matrix has a set of inputs, a set of outputs, controllable switch elements and a conductor arrangement that is connected to the inputs and outputs and to the controllable switch elements. The controllable switch elements together with the conductor arrangement produce switched electrical connection paths between at least two inputs and an output. The electrical connection paths contain connecting branches that, proceeding from the at least two inputs and the output, meet at a junction point. The connecting branches connected to the at least two inputs have identical electrical lengths up to the junction point.

9 Claims, 4 Drawing Sheets

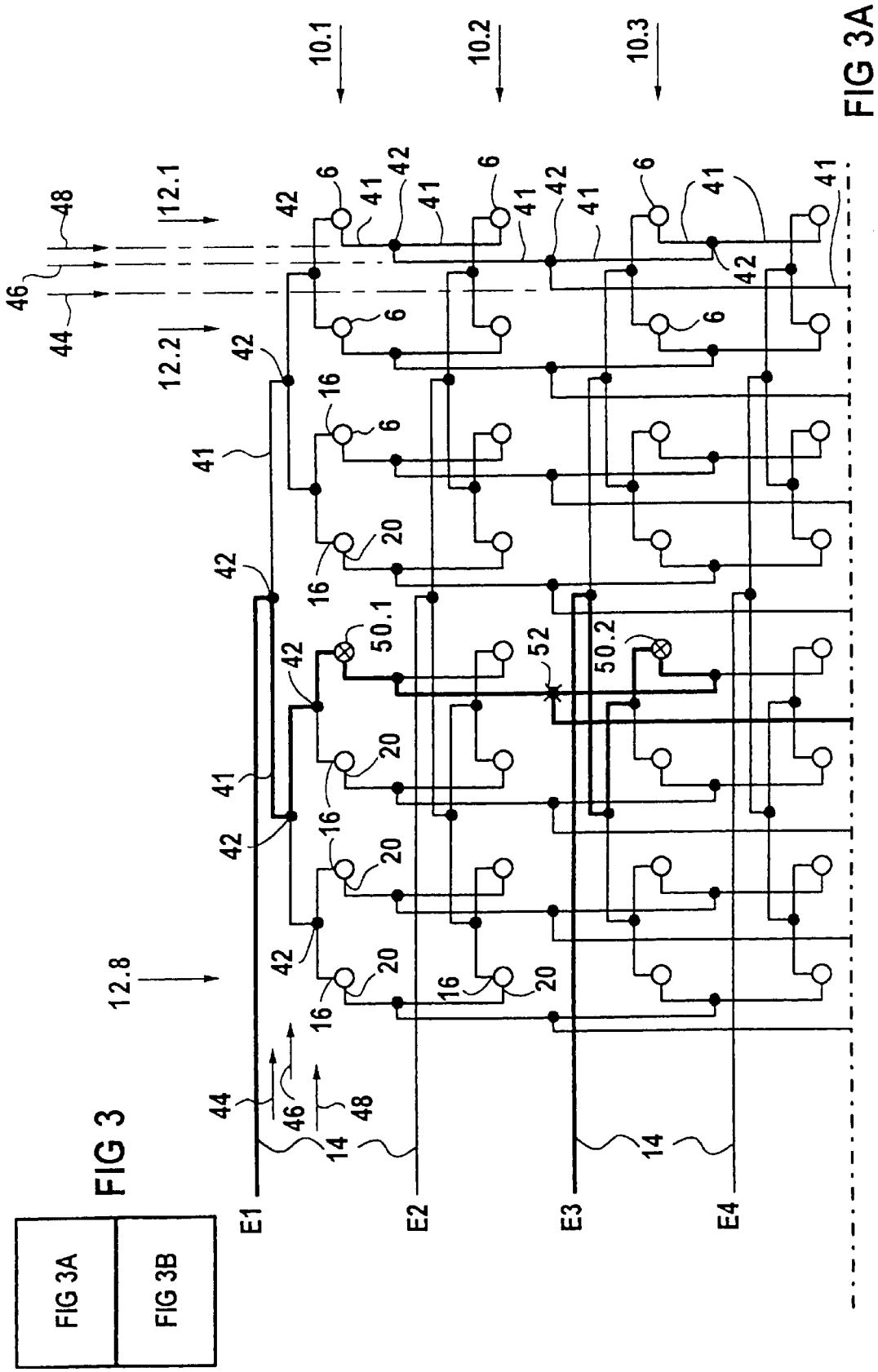

SWITCH MATRIX

BACKGROUND OF THE INVENTION

1. Field of the Invention

The present invention is directed to a switch matrix of the type having a set of inputs and a set of outputs, with controllable switch elements and a conductor arrangement that is connected to the inputs and outputs and to the controllable switch elements to set a signal path between an input and an output dependent on the states of the controllable switch elements.

2. Description of the Prior Art

A switch matrix of the type described above is disclosed in European Application EP 0 138 637.

With such a switch matrix, an input can be connected to an arbitrary output in order to forward an input signal to a selected output. Such a switch matrix can be employed in a diagnostic magnetic resonance apparatus in order to connect various reception antennas to specific signal processing channels. The reception antennas can be a number of a plurality of small local antennas (array antennas) lying next to one another, whose simultaneously received signals are evaluated in order to achieve a high signal-to-noise ratio. The reception signals of the individual local antennas are usually forwarded to separate evaluation channels and combined as digital signals in the image calculation. A combination of a number of reception signals before they are digitized is implemented, for example, when fewer evaluation channels than signaling reception channels are available in a magnetic resonance apparatus. An antenna array with switchable individual antennas and a signal combiner is disclosed in European Application 0 390 476. In the operation of this known arrangement, however, special steps must be taken to assure that all reception channels modify the phase position of the reception signals in the same way.

SUMMARY OF THE INVENTION

An object of the present invention is to provide a switch matrix that enables an equiphase combination of high-frequency (radio-frequency) signals of an arbitrary number of input channels onto an arbitrary output channel.

This object is achieved in a switch matrix according to the invention wherein the controllable switch elements with the conductor arrangement are fashioned for switching electrical connection paths between at least two inputs and one output, wherein the electrical connections comprise connection branches that, proceeding from the at least two inputs and the output, meet at a junction point, and that the connection branches connected to the at least two inputs exhibit identical electrical lengths up to the junction point. The identical electrical lengths assure that all connection branches impress an identical phase rotation on the signals up to the junction points at which the signals are brought together and combined. An equiphase combination of the signals of a number of input channels thus can already ensue at the analog side in the switch matrix without additional phase-determining components.

In an embodiment, all electrical connections between the inputs and outputs exhibit identical electrical lengths, as a result of which the phase rotation of the signals is the same at all outputs independently of the location of the junction point in the switch matrix.

In a further embodiment, the controllable switch elements are arranged in rows and columns, the conductor arrangement has first lines that are respectively connected between the inputs and first terminals of respective switch elements respectively arranged in a row (i.e., one first line between each input and each first terminal), and the conductor arrangement also has second lines respectively connected between the outputs and second terminals of respective switch elements in a column (i.e., one second line between each output and each second terminal). This switch matrix can be expanded or reduced to an arbitrary number of inputs and outputs.

In a first version of this embodiment of the switch matrix, each first line includes an input line section that connects an input to the first terminal of a switch element of a row which is also in an end column. Each first line also includes connecting line sections of identical length that respectively connect the first terminal of neighboring switch elements of the corresponding row. Each second line includes an output line section that connects an output to the second terminal of a switch element of a column which is also in an end row. Each second line also includes connecting sections of identical length that respectively connect the second terminals of neighboring switch elements of the corresponding column. The electrical lengths of the input line sections respectively decrease by the length of the second connecting line sections with increasing distance of the corresponding row from the end row. The different line lengths within the arrangement of the switch elements are thereby compensated by the different lengths of the external line sections. An identical structure of the elements of the switch matrix is thereby particularly advantageous; large switch matrices can also be easily realized. Moreover, the structure of the connecting lines between the switch elements can be fashioned in a simple way. The switch elements can be arranged with relatively small spacing therebetween, allowing a compact structure of the switch matrix to be achieved.

In a second version of the aforementioned embodiment of the switch matrix the first and second lines respectively have a first and second tree structures. Respectively proceeding from the corresponding input or output, the tree structures fan out into branch lines up to the first terminals of the respective switch elements of a row or up to the respective second terminals of the switch elements of a column. The electrical lengths of the branch lines are the same from the corresponding input up to all first terminals, or from the corresponding output up to all second terminals. The length of the spur lines remains constant independently of which switch element is active (conducting). All lines that lead away from the active switch element, and that are not terminated, are spur lines. When the length of all spur lines is the same, their influence can be compensated.

In a further variation of this version the tree structures in successive branching levels respectively branch into two branch lines until, in a last branching level, the number of branch lines corresponds to the number of rows or to the number of columns. Compared to a star-shaped tree structure, this type of tree structure has the advantage of a lower number of branch lines overall, allowing a compact structure of the switch matrix.

The switch matrix is especially suited for the equiphase combination of analog high-frequency signals in the megahertz range that are received as magnetic resonance signals from various antennas. The characteristic impedance of the conductors in the conductor arrangement is set so that no signal reflections occur at the junction points.

DESCRIPTION OF THE PREFERRED EMBODIMENTS

Figure 1:
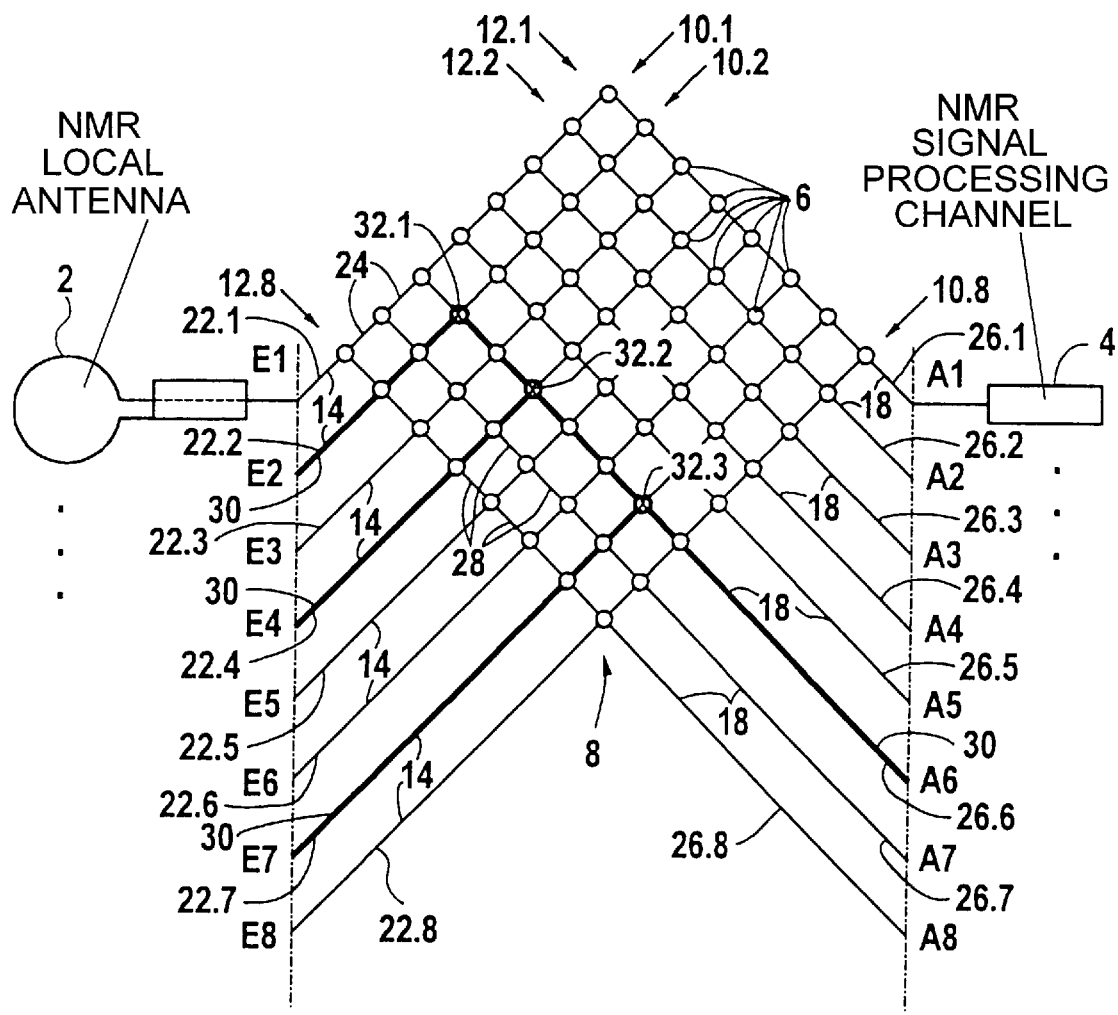
FIG. 1 shows a schematic illustration of a first embodiment of a switch matrix according to the invention with a conductor arrangement that is constructed in the fashion of a crossbar distributor.

The switch matrix shown in a schematic illustration in FIG. 1 is utilized in a diagnostic magnetic resonance apparatus. It has eight inputs E1 through E8 that are each connected to a reception antenna 2 of the diagnostic magnetic resonance apparatus. As an example, only the antenna 2 connected to the input E1 is shown in FIG. 1. The switch matrix has eight outputs A1 through A8 that are each connected to a signal processing channel 4 of the magnetic resonance apparatus. Only the signal processing channel 4 connected to the output A1 is shown as a representative of all signal processing channels 4. Switch elements 6, which are symbolized here as circles, are provided in order to electrically connect at least two of the inputs E1 through E8 to one of the outputs A1 through A8. For example, the switch element 6 are arranged in a regular grid at intersections of rows 10.1 through 10.8 with columns 12.1 through 12.8. For clarity, only a few switch elements 6 are identified with the reference number 6.

Via a conductor arrangement 8, the switch elements 6 are electrically connected to the inputs E1 through E8 as well as to the outputs A1 through A8. The number of rows 10.1 through 10.8 corresponds to the number of inputs E1 through E8 and the number of columns 12.1 through 12.8 corresponds to the number of outputs A1 through A8. The switch elements 6 belonging to the end row 10.8 are arranged neighboring the outputs A1 through A8, and the switch elements 6 belonging to the end column 12.8 are arranged neighboring the inputs E1 through E8.

Figure 2:
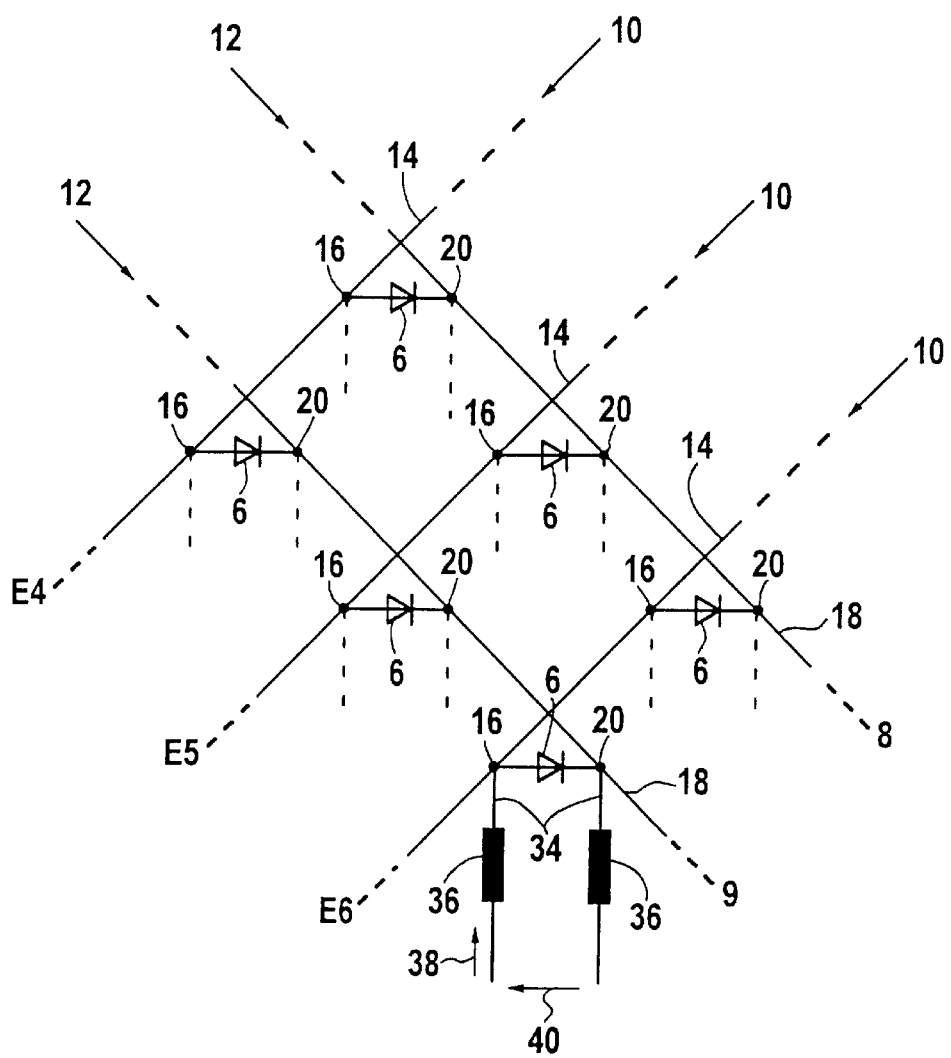
FIG. 2 shows a portion of the switch matrix of FIG. 1 with a few switch elements.

The conductor arrangement 8 includes first lines 14 that are respectively connected to the inputs E1 through E8 and to first terminals 16 of the switch elements 6 in one of the rows 10.1 through 10.8. The first terminals 16 of the switch elements 6 in rows 10.4, 10.5 and 10.6 as an example are shown in FIG. 2. The conductor arrangement 8 further includes second lines 18 that are respectively connected to one of the outputs A1 through A8 and second terminals 20 of the switch elements 6 of one of the columns 12.1 through 12.8. The second terminals 20 of the switch elements 6 are likewise shown in FIG. 2 for columns 12.4 and 12.5 as an example. The first lines 14 are composed of input line sections 22.1 through 22.8 (see FIG. 1) that each connect one of the inputs E1 through E8 to the respective first terminal 16 of the switch elements 6 in the rows 10.1 through 10.8 which also belong to the end column 12.8. The first terminals 16 of neighboring switch elements 6 of rows 10.1 through 10.8 are connected by first connecting line sections 24 of identical length, these connecting line sections respectively forming sections of the first lines 14. Similar to the first lines 14, the second lines 18 include output line sections 26.1 through 26.8 that each connect one of the outputs A1 through A8 to the respective second terminals 20 of the switch elements 6 in the columns 12.1 through 12.8 which also belong to the end row 10.8. Each second line 18 includes second connecting lines 28 of identical length that respectively connect the second terminals 18 of neighboring switch elements 6 of the corresponding columns 12.1 through 12.8.

The line lengths of the input line sections 22.1 through 22.7 are respectively shorter by the length of the second line sections 28 with decreasing distance of the respective rows 10.1 through 10.7 from the end row 10.8. The input line section 22.8 must be a length which is sufficiently long so as to assure that line lengths decreasing step-by-step for all input line sections 22.1 through 22.7 can be accommodated. Correspondingly, the line lengths of the output line sections 26.1 through 26.7 are respectively shorter by the length of the first line sections 24 with decreasing distance from the end column 12.8.

As a result of the above-described structure of the switch matrix, it is possible to combine high-frequency input signals equiphase with the switch matrix, as explained below. For example, the inputs E2, E4 and E7 are connected to the output A6. To that end, the switch elements 6 identified with crosses 32.1 through 32.3 (FIG. 1) are activated, and the electrical connection paths 30 produced in this way are shown in boldface in FIG. 1. The electrical connection paths 30 are composed of connecting branches that are connected to the corresponding inputs and to the corresponding output, and that meet at two junction points (in the case of three inputs electrically connected to one another). The first junction point is formed by the conductive switch element 6, which is identified by the cross 32.2. The second junction point is formed by the conductive switch element 6, which is identified by the cross 32.3. Proceeding from the corresponding inputs E2, E4 and E7, the electrical lengths of the respective connecting branches to each of the junction points 32.2 or 32.3 are identical; as a result whereof signals can be combined equiphase at the junction points 32.2 and 32.3. The different line lengths within the arrangement of the switch elements 6 are compensated by different lengths of the input line sections 22.2, 22.4, 22.7. Within the arrangement of the switch elements 6, the signal path for the signal from input E2 up to the junction point 32.3 is longer by a total of five connecting conductor sections 28 than the signal path for the signal from the input E7, which only includes the connecting line sections 24. This difference is compensated by the longer line length of the input line section 22.7 compared to the line length of the input line section 22.2. The input line section 22.8 is longer by the line length of a total of five connecting line sections 28. Analogous conditions arise for the signal paths to the junction point 32.2. Additionally, different lengths of the output line sections 26.1 through 26.8 assure that the phase position at each output A1 through A16 is the same, regardless of which inputs are connected to which output.

FIG. 2 shows a portion of the switch matrix according to FIG. 1. High-frequency switch diodes (PIN diodes) are employed as the switch elements 6 at the intersections of the rows 10.1 through 10.8 and the columns 12.1 through 12.8. Each PIN diode is connected to two control lines 34. The PIN diodes 6 can be supplied with a control signal via the control lines 34 in order to switch them into the transmissive or blocking condition. The control circuit is decoupled from the switch matrix via blocking inductors 36. A current in the direction of arrow 38 switches the PIN diode 6 conducting, whereas an inhibiting voltage having a polarity identified by an arrow 40 switches the PIN diode 6 into the blocking condition.

Figure 3B:
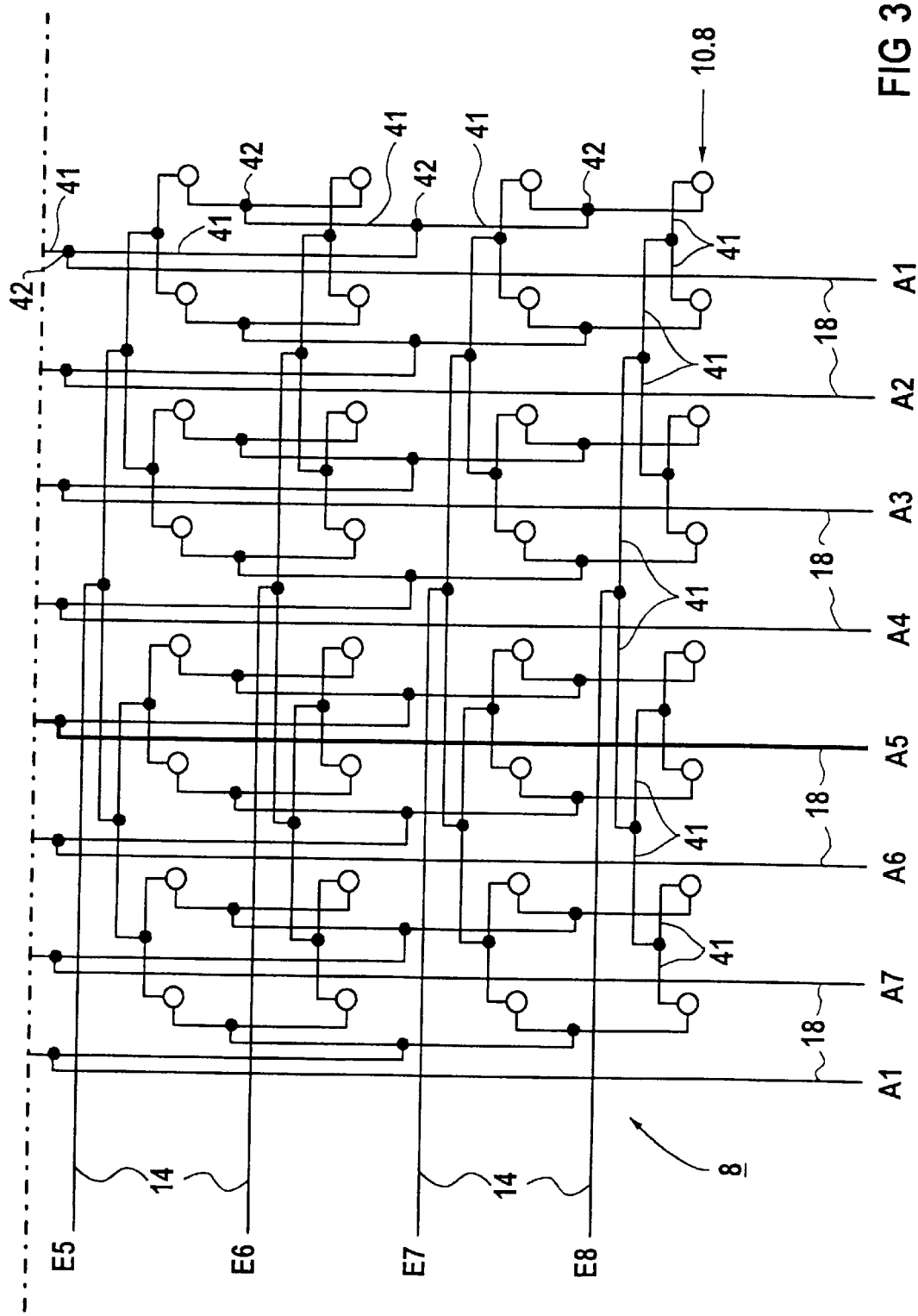
FIG. 3 (Composed of FIGS. 3A and 3B) is a schematic illustration of a second embodiment of a switch matrix according to the invention with a tree-like conductor arrangement.

In the second embodiment shown in a schematic illustration in FIG. 3, the switch matrix has eight inputs E1 through E8 and eight outputs A1 through A8. The conductor arrangement 8, which connects the inputs E1 through E8 to the outputs A1 through A8 via the controllable switch elements 6, likewise includes first lines 14 that each connect one of the inputs E1 through E8 to the respective first terminals 16 of switch elements 6 in one of the rows 10.1 through 10.8. In the same way, the outputs A1 through A8 are connected via second lines 18 to the respective second terminals of the switch elements 6 in one of the columns 12.1 through 12.8. Differing from the embodiment of FIG. 1, the first lines 14 and the second lines 18 in the embodiment of FIG. 3 respectively have first and second tree structures . The first lines 14 are identical to one another, just as the second lines 18 are identical to one another. The first and second lines 14 and 18 respectively fan into branch lines 41, the first lines 14 proceeding from the inputs E1 through E8 to the first terminals 16 of the switch elements 6 of the corresponding row 10.1 through 10.8, and the second lines 18 from the outputs A1 through A8 to the second terminals 20 of the switch elements 6 of the corresponding column 12.1 through 12.8. The electrical lengths of the branch lines 41 from each of the inputs E1 through E8 up to the first terminals 16 of a given row 10.1 through 10.8, and the electrical lengths of the branch lines 41 from each of the outputs A1 through A8 up to the second terminals 20 of a corresponding column 12.1 through 12.8, are the same within the tree structures. The tree structures have symmetrically arranged branching points 42 at which—proceeding from the inputs E1 through E8 or from the outputs A1 through A8—a branching into two branch lines 41 symmetrically ensues in each of a number of branching levels 44, 46, 48 until, in the last branching level 48, the number of branch lines 41 is equal to the number of switch elements in the rows 10.1 through 10.8 or in the columns 12.1 through 12.8. For clarity in FIG. 3, the branches 41 in the branching levels 44, 46, 48 are not always shown of equal length; the branching points 42 therefore do not always lie symmetrically in the drawing illustration. The junction points at which the signals from various inputs E1 through E8 meet lie on the branching points 42 in this embodiment of the conductor arrangement 8.

As an example, connections with which the inputs E1 and E3 are connected to the output A5 are shown in boldface in FIG. 3. To that end, the switch elements 6 identified with the crosses 50.1 and 50.2 are in the conducting state; the junction point at which the signals of the two inputs are combined is identified by a cross 52.

PIN diodes are likewise provided in the embodiment of FIG. 3 as switch elements 6, corresponding to the embodiment of FIG. 1. In both embodiments, PIN diode combinations, for example a T-shaped arrangement of PIN diodes, alternative can be employed as switch elements 6 if the required blocking and conducting properties cannot be realized with a single PIN diode.

Although various minor modifications might be suggested by those skilled in the art, it should be understood that our wish to embody within the scope of the patent warranted hereon all such modifications as reasonably and properly come with the scope of our contribution to the art.

We claim as our invention:

1. A switch matrix comprising:
   a plurality of inputs;
   a plurality of outputs;
   a plurality of controllable switch elements each controllable switch element having a conducting state and a blocking state;
   a conductor arrangement connected to said inputs and to said outputs and to said controllable switch elements, said controllable switch elements and said conductor arrangement, in combination producing a switched electrical connection path between at least two of said inputs and one of said outputs dependent on the state of said controllable switch elements; and
   each electrical connection path comprising at least two input connecting branches respectively proceeding from said at least two inputs, and an output connecting branch proceeding from said output, said at least two input branches and said output branch meeting at a junction point in said electrical connection path, and said at least two input connecting branches respectively having identical electrical lengths between said at least two inputs and said junction point.

2. A switch matrix as claimed in claim 1 wherein all electrical connection paths between said inputs and said outputs respectively have identical electrical lengths.

3. A switch matrix as claimed in claim 1 wherein said plurality of controllable switch elements are arranged in a plurality of rows and a plurality of columns, and wherein each of said controllable switch elements has a first terminal and a second terminal, and wherein said conductor arrangement comprises a plurality of first lines respectively connected between said inputs and the respective first terminals of the controllable switch elements in one of said rows, and a plurality of second lines respectively connected between said outputs and the respective second terminals of the controllable switch elements in one of said columns.

4. A switch matrix as claimed in claim 3 wherein said plurality of rows includes an end row disposed closest to said plurality of outputs and wherein said plurality of columns includes an end column disposed closest to said plurality of inputs, and wherein each of said first lines comprises an input line section connecting one of said inputs to the first terminal of the controllable switch element in said one of said rows which is also in said end column, and wherein each of said first lines further comprises a plurality of first connecting line sections of identical lengths respectively connecting the first terminals of neighboring ones of said controllable switch elements in said one of said rows, and wherein each of said second lines comprises an output line section connecting one of said outputs to the second terminal of the controllable switch element in said one of said columns which is also in said end row, and wherein each of said second lines further comprises a plurality of second connecting line sections of identical lengths respectively connecting the second terminals of neighboring ones of said controllable switch elements of said one of said columns, said input line sections having respectively different electrical lengths which successively decrease by the respective lengths of the second connecting line sections with increasing distance of said one of said rows from said end row.

5. A switch matrix as claimed in claim 4 wherein said output line sections respectively have electrical lengths successively decreasing by respective lengths of said first connecting line sections with increasing distance from said end column.

6. A switch matrix as claimed in claim 3 wherein said junction point comprises any one of said second terminals of said controllable switch elements.

7. A switch matrix as claimed in claim 3 wherein each of said first line comprises a first tree structure comprised of a plurality of branch lines proceeding from the input to which that first line is connected to the respective first terminals of the controllable switch elements of said one of said rows to which that first line is connected, wherein each of said second lines comprises a second tree structure having a plurality of branch lines respectively proceeding from the output to which that second line is connected to the second terminals of the controllable switch elements of said one of said columns to which that second line is connected, said branch lines in said first tree structure having respective identical lengths and said branch lines in said second tree structure having respective identical lengths.

8. A switch matrix as claimed in claim 7 wherein each of said first and second tree structures contains a plurality of branching points defining a plurality of branching levels including a last branching level, said first and second tree structures at each branching point branching into two of said branch lines, and said first tree structure having a plurality of branch lines in said last branching level equal to the plurality of said controllable switch elements in said one of said rows, and said second tree structure having a plurality of branch lines in said last branching level equal to the plurality of controllable switch elements in said one of said columns.

9. A switch matrix as claimed in claim 1 further comprising a plurality of local antennas of a magnetic resonance imaging apparatus respectively connected to said plurality of inputs, and a plurality of signal processing channels of said nuclear magnetic resonance imaging apparatus respectively connected to said plurality of outputs.

\* \* \* \* \*